United States Patent [19]

Perelle

[11] Patent Number: 5,438,252

[45] Date of Patent: Aug. 1, 1995

[54] POWER SUPPLY CONTROL MODULE FOR A BATTERY CONTROL SYSTEM OF AN APPLIANCE, AND A BATTERY EQUIPPED WITH SUCH A MODULE

[75] Inventor: Michel Perelle, Parcay Meslay, France

[73] Assignee: Societe Anonyme Dite: Saft, Romainville, France

[21] Appl. No.: 980,969

[22] Filed: Nov. 24, 1992

[30] Foreign Application Priority Data

Nov. 25, 1991 [FR] France ................. 91 14494

[51] Int. Cl.$^6$ .................................. H02J 7/04
[52] U.S. Cl. ........................................... 320/44
[58] Field of Search ........................... 320/44, 13, 39

[56] References Cited

U.S. PATENT DOCUMENTS

| | | | |
|---|---|---|---|
| 3,900,785 | 8/1975 | Alric et al. | 320/44 |
| 4,595,872 | 6/1986 | Ball | 320/13 |
| 5,028,860 | 7/1991 | Amano | 320/23 |
| 5,043,651 | 8/1991 | Tamura | 320/43 |
| 5,124,627 | 6/1992 | Okada | 320/39 |
| 5,150,031 | 9/1992 | James et al. | 320/2 |
| 5,206,097 | 4/1993 | Burns et al. | 320/48 X |

FOREIGN PATENT DOCUMENTS

| | | |
|---|---|---|
| 0448767 | 10/1991 | European Pat. Off. |
| 2645352 | 10/1990 | France. |
| 3832840 | 3/1990 | Germany. |
| 4103470 | 8/1991 | Germany. |

*Primary Examiner*—Steven L. Stephan
*Assistant Examiner*—Edward Tso
*Attorney, Agent, or Firm*—Sughrue, Mion, Zinn, Macpeak & Seas

[57] ABSTRACT

The power supply control module is designed to be associated with a power supply battery (1) for powering an appliance (2). The control module includes a detector circuit (4) associated with a switch circuit (5) placed in the loop via which the battery powers the appliance, the detector circuit including a shunt resistor (9) which is inserted between the battery and the switch circuit, and two operational amplifiers (7, 8) connected as comparators, one of the amplifiers being active when the battery is being used as a power source, and the other amplifier being active during fast battery-charging. The second amplifier (8) is also connected to the terminals of a diode (19) in parallel with the switch circuit, so that the amplifier is active during trickle battery-charging. The battery preferably includes a power supply control module housed inside the pack in which it is packaged.

5 Claims, 1 Drawing Sheet

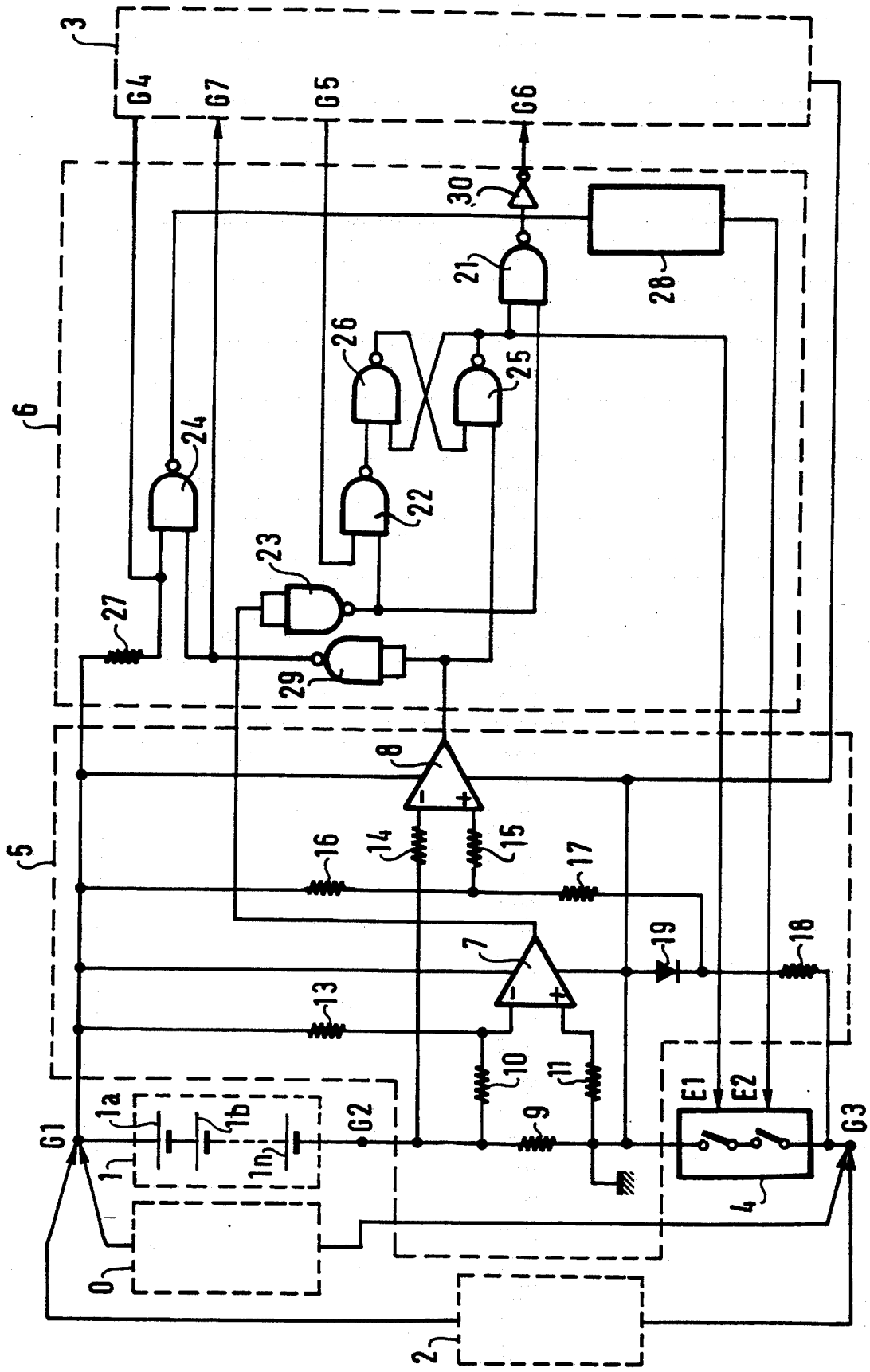

POWER SUPPLY CONTROL MODULE FOR A BATTERY CONTROL SYSTEM OF AN APPLIANCE, AND A BATTERY EQUIPPED WITH SUCH A MODULE

BACKGROUND OF THE INVENTION

The invention relates to a power supply control module for a battery control system for controlling the battery of an appliance powered in this way, as well as to batteries equipped with such modules, in particular lithium-type batteries.

Numerous electrical appliances, in particular autonomous and/or portable appliances, are powered by batteries which have different chemical constituents, but which are designed to be housed in the same receptacles in the appliances to be powered, so that, in practice, the batteries are interchangeable.

Although they are interchangeable, such batteries do not have exactly the same electrical characteristics, in particular with respect to charging and discharging.

It is well known to monitor a battery power supply by means of a control system comprising apparatus and/or a circuit, whereby at least one of the parameters of the battery can be measured, e.g. the voltage across its terminals, and/or optionally the battery can be caused to be recharged and/or to be taken out of service whenever necessary.

Such a control system is not generally capable of recognizing the characteristics of the type of battery to which it is connected.

A power supply that is not sufficiently high-performance may have serious drawbacks for the user, in particular if the power supply gives rise to incorrect and/or sporadic operation of the appliance or of the control system thereof. Moreover, in some cases, the condition of the battery might deteriorate as a result.

SUMMARY OF THE INVENTION

The invention therefore provides a power supply control module for a battery control system for controlling the battery of an appliance, the control module preferably being permanently associated with a battery regardless of whether the battery is being used or not, for powering the appliance and the other constituent parts of the control system powered by the battery.

According to a characteristic of the invention, the control module includes a detector circuit associated with a switch circuit placed in the power loop via which the battery powers the appliance, and the detector circuit includes a shunt resistor inserted between the battery and the switch circuit in the loop via which the appliance is powered, the shunt resistor being connected via its terminals to the inputs of a first operational amplifier which is connected as a comparator and which is used as a current detector so as to supply an output current only when in the presence of a battery-in-use current flowing through the shunt resistor that is higher than a first predetermined value.

According to another characteristic of the invention, a second operational amplifier is connected as a comparator and is used as a current detector, the inputs of the second operational amplifier being connected to the terminals of the shunt resistor, and, via the shunt resistor, to the terminals of a diode placed in series with a calibration resistor in a branch that is parallel to the switch circuit, the second operational amplifier supplying an output current only when in the presence either of a fast battery-charge current flowing through the shunt resistor and through the switch circuit that is higher than a second predetermined value, or else of a voltage across the terminals of the diode that corresponds to a trickle charge current flowing through the diode that is higher than a third predetermined value which is in turn much lower than the second predetermined value.

BRIEF DESCRIPTION OF THE DRAWINGS

The invention, and the characteristics and advantages thereof are specified in the following description given with reference to the accompanying drawing, in which:

the sole figure is a circuit diagram of a battery power supply for an electrical appliance, which power supply includes a power supply control module of the invention.

DESCRIPTION OF A PREFERRED EMBODIMENT

The power supply control module is designed to be associated with a battery 1 comprising at least one and commonly more storage cells, referenced $1a, 1b, \ldots, 1n$.

The battery 1 is provided to power an electrical appliance 2 that is supervised by a control system, e.g. organized around a microprocessor in a conventional manner which is not described below. The control system includes a power supply Control module of the invention, and various specialized modules referenced as sub-system 3 which are not described below because they are not directly related to the invention.

The battery power supply control module comprises a switch circuit 4, a detector circuit 5, and an interface logic circuit 6 connecting the detector circuit to the switch circuit and to the control system.

The battery 1 includes two end terminals G1 & G2, one of which is positive and the other of which is negative, via which terminals the battery powers both the appliance 2, and the circuits 4, 5, 6, and at least some of the modules in the control system.

The battery may optionally be recharged by means of a charger 0, e.g. for fast individual recharge of the storage cells $1a$ to $1n$.

The charger 0 and the electrical appliance 2 are not described in detail insofar as they belong to categories of equipment that are well known to a person skilled in the art, and insofar as their respective internal structures are not directly related to the invention.

The switch circuit 4 is a conventional piece of electronic circuitry which is inserted in series in the power supply loop via which the battery 1 powers the appliance 2, the switch circuit shown in the figure being inserted between the terminal G2 of the battery and a power supply terminal G3, with the appliance actually being powered via terminals G1 and G3, and the battery also actually being charged by the charger via terminals G1 and G3. The switch circuit 4 includes at least one, and in this example two, control inputs E1 and E2 which respectively act to interrupt the otherwise established internal conductive link between the terminals G2 and G3.

In a preferred embodiment, the switch circuit 4 is provided so as to be physically associated with the battery, together with circuits 5 and 6, e.g. in a module incorporated in the individual pack in which a storage cell designed to be used on its own is packaged, or in the common pack in which the set of storage cells comprising a battery are packaged.

The detector circuit 5 is organized around two operational amplifiers 7 & 8, and a shunt resistor 9.

The shunt resistor 9 is connected in series between the switch circuit 4, and the battery terminal G2. When the internal conductive link in the switch circuit is established, the current output by the battery flows through the shunt resistor.

The operational amplifiers are both connected similarly as comparators. One of the amplifiers is provided to act when the battery is being used as a power supply, and the other amplifier is provided to act during fast or trickle charging of the battery, the appliance not then being powered.

Operational amplifier 7 is connected to the terminals of the shunt resistor via two resistors 10 & 11 respectively connected to the inverting input and to the non-inverting input of the amplifier.

A high-resistance regulation resistor 13 also connects the inverting input of the operational amplifier 7 to the positive terminal G1, and co-operates with resistor 10 which sets the threshold (corresponding to the first predetermined value) at which the comparator circuit switches over when the appliance 2 is in use.

Amplifier 8 is active when the battery is being charged. The inverting input of the amplifier is connected to terminal G2 via a resistor 14, and its non-inverting input is connected via a resistor 15 to the common point between resistors 16 & 17 of a divider bridge connected at one of its ends to terminal G1 via resistor 16, and at the other end to terminal G3 via resistor 17 and a calibration resistor 18 in series, resistor 17 co-operating with the calibrating resistor 18 for setting the threshold (corresponding to the second predetermined value) at which the corresponding comparator circuit switches over during fast battery charging.

A diode 19 (optionally a light emitting diode) is inserted in series with the calibrating resistor 18 in a branch that is parallel to the switch circuit 4. The anode of the diode is connected to terminal G2 (as are the negative power supply inputs of the amplifiers 7 & 8 and of the control system 3) via the shunt resistor 9, and the cathode of the diode is connected to terminal G3 via resistor 18.

The diode enables operational amplifier 8 to detect the presence of a trickle charge current that (corresponding to the third predetermined value) is too low to be detected at the shunt resistor 9, since, compared with discharge and fast-charge currents, trickle charge currents are relatively low.

The interface circuit 6 is connected to the outputs of operational amplifiers 7 and 8.

The output signal of operational amplifier 7 is applied to respective first inputs of two NAND-type gates 21 and 22 via an inverter circuit 23, and the output of operational amplifier 8 is applied to respective first inputs of two NAND-type gates 24 and 25, which output is applied to gate 25 directly and to gate 24 via an inverter circuit 29.

A second input of each of gates 22 & 24 receives a signal from the control system 3 respectively via a terminal referenced G5 for gate 22, and via a terminal referenced G4 for gate 24, the second input of gate 24 also being connected to terminal G1 via a high-resistance resistor 27.

A NAND-type gate 26 completes the gate circuitry, and it is connected via its first input to the output of gate 22, and via its second input to the output of gate 25, the second input of gate 25 in turn being connected to the output of gate 26 in a conventional connection configuration.

Gate 23 makes it possible to power those constituent parts (not shown) of the control system 3 which are active when the battery is being used to power the appliance, said constituent parts being powered via gates 21 & 30 in series either directly, or else via the gate circuitry comprising gates 22, 25, & 26.

Gate 23 also controls establishing the internal conductive link in the switch circuit 4 between terminals G2 and G3 via a control input E1 of the switch circuit and as a function of the respective levels of the output signal from amplifier 7 and of the corresponding signal supplied to gate 22 of the gate circuitry comprising gates 22, 25, & 26 by the control system 3 via a terminal referenced G4.

Gate 29 makes it possible to power those constituent parts (not shown) of the control system 3 which are active when the battery is being charged.

Via gate 24, gate 29 also controls the control circuitry 28 for controlling the switch circuit 4. In this way, gate 29 acts on input E2 of the switch circuit to cause the internal conductive link therein either to be established if it is indicated that the battery is being fast-charged, or else to be interrupted if it is indicated that the battery is being trickle-charged.

The control circuitry 28 is, for example, organized around a multivibrator (not shown).

When the battery 1 equipped with the power supply control module is left on its own, e.g. in storage, without being connected either to an appliance 2 and to the associated control logic circuitry, or to a charger 0, the internal conductive link in the switch circuit 4 is interrupted and the only effective consumption is, in practice, that of the operational amplifiers 7 & 8, and of the resistors associated therewith.

Such consumption is negligible if the amplifiers are used as comparators and have a very low unit consumption due to their technology, e.g. of the C-MOS type.

If the battery 1 is being fast-charged, a high current flows through the shunt resistor 9 and acts on the operational amplifier 8, those constituent parts of the modules in the control sub-system 3 which are active during battery charging are powered, and the switch circuit 4 then conducts.

If the battery 1 is being trickle-charged, it is the voltage across the terminals of the diode 19 that is taken into account by the operational amplifier 8, since the current flowing through the shunt resistor 9 is not high enough, and the switch circuit 4 does not then conduct.

When the battery 1 is being used to power the appliance 2, the operational amplifier 7 powers those constituent parts of the control sub-system 3 which are active when the battery is in use, so as to keep the switch circuit 4 conducting in the absence of a fault, such as a current surge, or total discharge, while the battery is being discharged, the circuit 6 then being informed of the fault via terminal G5.

Insofar as at least the detector circuit 5 of a power supply control module is associated permanently with a battery of a given type, e.g. by being incorporated in the pack in which the battery is packaged, optionally together with the other two circuits, it is not difficult always to provide a module which is specifically adapted to the specific characteristics of the given type of battery, and which is also capable of feeding the remaining constituent parts of a battery control system under standardized conditions for different types of interchangeable battery.

What is claimed is:

1. A power supply control module for a supply battery (1) for use in an appliance power supply control system (3) which controls the supply of power to the appliance (2), said power supply control module controlling the supply of operating current to the power supply control system (3), and having input terminals (G1, G3) adapted to be connected to a battery and to a battery charger, said control module comprising a current detector circuit (5) associated with a switch circuit (4) placed in a power loop which includes said input terminals (G1, G3) and via which the battery supplies operating power to the appliance, said detector circuit comprising:

a shunt resistor (9) having terminals and being inserted in series with the switch circuit in the power loop via which the appliance is powered;

an operational amplifier means (8) which is connected as a comparator so as to have low consumption, and which functions as a battery current detector when the battery is connected in series with the power loop and a battery charger is connected across the feed terminals (G1, G3);

a diode (19) having terminals;

a calibration resistor 18;

the operational amplifier means (8) being connected to the terminals of the shunt resistor, and, via the shunt resistor, to said terminals of said diode (19), said diode being placed in series with said calibration resistor (18) in a branch that is in parallel with the switch circuit, the operational amplifier means (8) supplying an output current only when either there flows through the shunt resistor and through the switch circuit a fast battery charge current that is higher than one predetermined value, or else there appears across the terminals of the diode a voltage that corresponds to a trickle charge current which flows through the diode and which is higher than another predetermined value which is in turn much lower than the one predetermined value; and an interface logic circuit means (6), connected to said current detector circuit (5) and to said switch circuit (4), responsive to the output current from said operational amplifier means (8) to supply operating current to the power supply control system.

2. The power supply control module according to claim 1, further comprising: a lightweight storage cell battery, permanently connected in series with said feed terminals (G1, G3) and said switch circuit (4).

3. A power supply control module for a supply battery (1) for use in an appliance power supply control system (3) which controls the supply of power to the appliance (2), said power supply control module comprising a detector circuit (5) associated with a switch circuit (4) placed in a power loop via which the battery powers the appliance; said detector circuit comprising: a first operational amplifier means (7), and a shunt resistor (9) inserted in series between the battery and said switch circuit in said power loop, the shunt resistor having terminals connected to respective inputs (+, −) of said first operational amplifier means (7) which is connected as a comparator so as to have low consumption, and which is operative to function as a current detector so as to supply a first operating current to said control module only when a battery-in-use current flowing through the shunt resistor is higher than said first predetermined value; said detector circuit further comprising a second operational amplifier means (8) having inputs (+, −) coupled to said shunt resistor (9), the first operational amplifier means (7) being operative only when the battery is in use as a power source to supply operating power to the appliance, and the second operational amplifier means (8) being operative only when the battery is being charged by a battery-charger connected across 13 the series circuit of the battery, the shunt resistor and the switch circuit.

4. A power supply control module according to claim 3, comprising interface logic circuit means (6) coupled to said first and second operational amplifier means (7, 8) of said detector circuit (5), to the switch circuit (4), and to the power supply control system (3), the logic circuit means (6) controlling both the operating power supplied from the battery to the appliance, and also controlling the switch circuit (4).

5. A power supply control module for a supply battery (1) for use in an appliance power supply control system (3) which controls the supply of power to the appliance (2), said power supply control module comprising a detector circuit (5) associated with a switch circuit (4) placed in a power loop via which the battery powers the appliance;

said detector circuit comprising:

a shunt resistor (9) having terminals and being inserted in series between the battery and the switch circuit in said power loop;

means for establishing first, second and third predetermined current values;

a first operational amplifier means (7) which is connected as a comparator so as to have low consumption, and which functions as a detector of current flowing through said shunt resistor so as to supply a first control current to said power supply control system (3) only when a battery-in-use current flowing through the shunt resistor is higher than said first predetermined value, respective inputs (+, −) of said first operational amplifier means (7) being connected to said terminals of said shunt resistor;

a diode (19) having terminals;

a calibration resistor 18; and a second operational amplifier means (8) which is connected as a comparator so as to have low consumption, and which functions as a current detector, said second operational amplifier means (8) having respective inputs (+, −) connected to the terminals of the shunt resistor, and, via the shunt resistor, to said terminals of said diode (19), said diode being connected in series with said calibration resistor (18) in a branch that is parallel to said switch circuit (4), the second operational amplifier means (8) supplying to said power supply control system (3) a second control current only when either there flows through the shunt resistor and through the switch circuit a fast battery-charge current that is higher than said second predetermined value, or else there appears across the terminals of the diode a voltage that corresponds to a trickle charge current which flows through the diode and which is higher than said third predetermined value which is in turn much lower than the second predetermined value.

* * * * *